US006899759B2

United States Patent
Kishida et al.

(10) Patent No.: US 6,899,759 B2
(45) Date of Patent: May 31, 2005

(54) SINGLE CRYSTAL PRODUCTION METHOD

(75) Inventors: Yutaka Kishida, Yamaguchi (JP);
Teruyuki Tamaki, Yamaguchi (JP);
Seiki Takebayashi, Yamaguchi (JP);
Wataru Ohashi, Chiba (JP)

(73) Assignee: Siltronic AG, Munich (DE)

( * ) Notice: Subject to any disclaimer, the term of this patent is extended or adjusted under 35 U.S.C. 154(b) by 146 days.

(21) Appl. No.: 10/283,683

(22) Filed: Oct. 30, 2002

(65) Prior Publication Data

US 2003/0089301 A1 May 15, 2003

(30) Foreign Application Priority Data

Oct. 30, 2001 (JP) ........................................ 2001-333325

(51) Int. Cl.[7] ............................................. C30B 15/20
(52) U.S. Cl. ............................ 117/14; 117/13; 117/28; 117/217; 117/218
(58) Field of Search .............................. 117/13, 14, 28, 117/217, 218

(56) References Cited

U.S. PATENT DOCUMENTS 6,458,201 B2 * 10/2002 Kitagawa et al. .............. 117/13

FOREIGN PATENT DOCUMENTS

| EP | 055 619 | 7/1982 |
|---|---|---|
| EP | 462 741 | 12/1991 |
| JP | 2000-086387 | 3/2000 |
| JP | 2000-169290 | 6/2000 |

OTHER PUBLICATIONS

Patent Abstract of Japan Corresponding to JP 2000–086387.
Patent Abstract of Japan Corresponding to JP 2000–169290.
Patent Abstract of Japan Corresponding to JP 06–219889.
JSME Mechanical Engineers' Handbook, 1987, p. A3–135.

* cited by examiner

Primary Examiner—Felisa Hiteshew
(74) Attorney, Agent, or Firm—Collard & Roe, P.C.

(57) ABSTRACT

A single crystal production method based on the Czochralski method comprises controlling a number of crucible rotations and crystal rotations so that a number of vibrations for driving a melt, determined on the basis of the number of crucible and crystal rotations during a single crystal growing procedure, is outside a range from 95% to 105% of a number of sloshing resonance vibrations of the melt. In another embodiment, the method comprises controlling a number of rotations of a crystal and crucible, so that when a number of vibrations for driving a melt, determined by the number of crucible and crystal rotations during a single crystal growing procedure, is within a range from 95% to 105% of a number of sloshing resonance vibrations of the melt, the number of vibrations of the melt due to sloshing does not exceed 2000 times during a period when the number of vibrations is within that range.

2 Claims, 3 Drawing Sheets

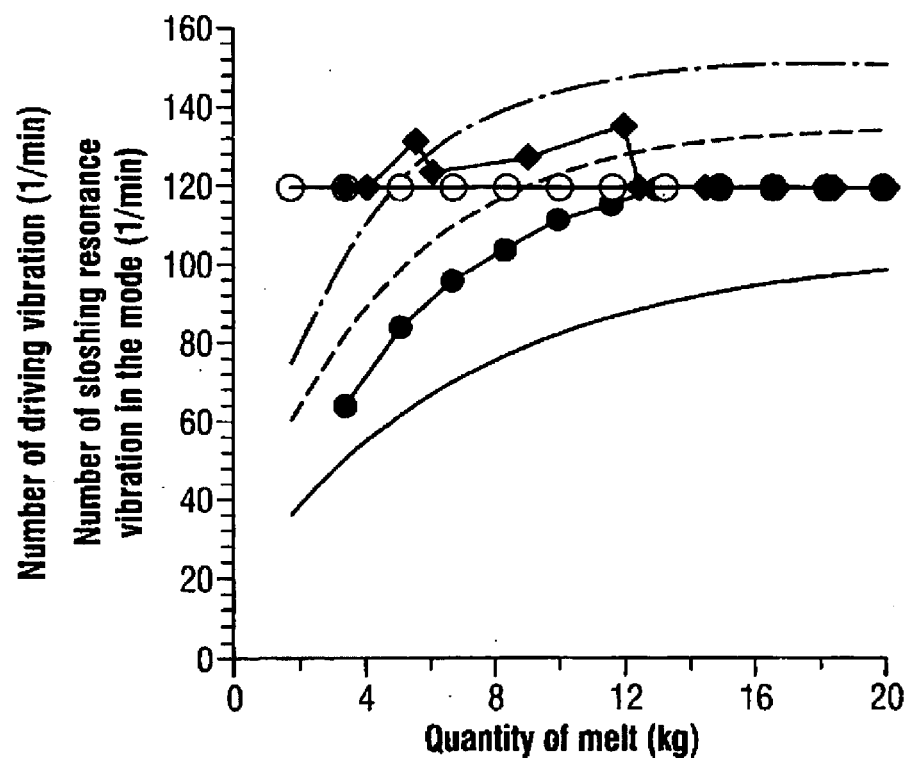
Fig. 3
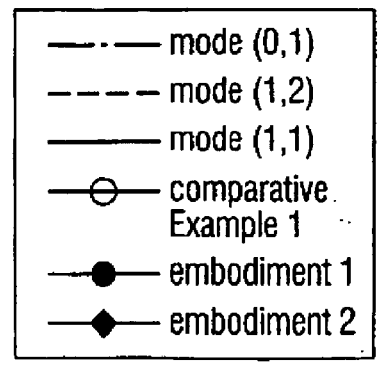

SINGLE CRYSTAL PRODUCTION METHOD

BACKGROUND OF THE INVENTION

1. Field of the Invention

The present invention relates to a single crystal production method based on the Czochralski method and more specifically, to a method for preventing a crystal from being dislocated, becoming polycrystalline and being deformed due to waves on the surface of a melt.

2. The Prior Art

While crystals of various element semiconductors and compound semiconductors have been used as a substrate for making electronic devices and photoelectric devices, the Czochralski method is used for producing these crystals. The Czochralski method is useful for producing large crystals, and most silicon single crystals in the current semiconductor device fabrication are produced by means of the Czochralski method.

FIG. 1 is a longitudinal sectional view of a crystal puller as a model, based on the Czochralski method. In this crystal puller, a melt 4 is obtained by filling with the crystal raw material a crucible 2 housed in a susceptor 1 disposed on a crucible axis 7 that can be revolved as well as rise and fall, and by heating the crystal raw material with a heater 3 to thereby melt the crystal raw material. The puller comprises, on its top, a wire 21 and a driving mechanism 20 for revolving and pulling up the crystal. A seed crystal 5 hung on the wire is dipped in the melt 4 and thereafter pulled up with the seed crystal 5 and the crucible 2 revolved, to thereby obtain a crystal 6. Since temperature becomes high inside the puller, the puller body 9 is protected by thermal insulation materials 8 and 10.

However, the stability of the surface of the melt greatly influences the stability of growth of a single crystal, because, according to the Czochralski method, a single crystal is grown from the free surface of the melt. Namely, the surface of the melt may be waved due to mechanical vibrations, the crystal may be dislocated or become polycrystalline due to increase of the temperature fluctuations accompanying the waves, so that the crystal cannot be used as a substrate for a semiconductor device. And, even if the crystal can avoid these problems, the crystal is likely to undergo deformation of the crystal shape and the product yield may be lowered because the crystal does not take a predetermined shape. Further, in case of a melt with a low viscosity, e.g. silicon and in case a large quantity of a melt is used in a large crucible, once large waves occur, the waves are not easily settled because the inertia of the melt is large with respect to the viscosity.

Accordingly, as to the single crystal production apparatus based on the Czochralski method, it is suggested that the rotation axes of the crucible and the crystal should be adjusted in a vertical direction in order to prevent the melt from being waved due to the rotation of the crystal and the crucible; the revolution central axes of the crucible and the crystal should be adjusted to accord with each other as much as possible, and the vibrations from the driving system relating to the rotation and the vertical movement of the crucible and the crystal are not transmitted to the melt (see Japanese Patent Application Disclosure Nos. 2000-169290 and 2000-86387).

As described above, thorough countermeasures against the driving system are employed to be able to settle waves on the surface of the melt that permanently occur during the single crystal production. However, in many cases, many waves occurring during the actual crystal pulling-up have a characteristic of suddenly starting to occur during the single crystal growing and being settled after a certain time. For this kind of waves on the surface of the melt, it is clear that the improvement of precision in setting the driving system and the countermeasures against the vibration transmission system are not clearly successful as a direct solution, and they are not very effective in fact.

SUMMARY OF THE INVENTION

The object of the present invention is to improve the product yield by preventing a crystal from being dislocated, becoming polycrystalline and being deformed.

On the basis of the examination and research for achieving the above-mentioned object, the inventors found that the sloshing resonance of the melt in the crucible caused waves that occurred on the surface of the melt at the time of pulling up a single crystal in accordance with the Czochralski method. Namely, while the number of sloshing resonance vibrations of the melt increases as the melt decreases because of the single crystal growing, the remarkable waves start to occur when the number of sloshing vibrations comes close to a value obtained by increasing the number of crystal rotations by times of an integer (particularly, by times of the number of crystal habit lines).

Further, it becomes clear that the waves on the surface of the melt are settled when the quantity of the melt further decreases and the number of sloshing resonance vibrations exceeds the number of vibrations at which the revolution of the crystal drives the melt.

Accordingly, the present invention provides that the number of crucible and crystal rotations or either of the two should be controlled, to keep the number of vibrations for driving the melt, determined on the basis of the number of crucible and crystal rotations during the single crystal growing procedure outside the range from 95% to 105% of the number of sloshing resonance vibrations (the peculiar number of vibrations determined on the basis of the shape of a crucible and the quantity of a melt) of the melt, said sloshing resonance vibrations varying as the single crystal pulling-up progresses.

As to the silicon single crystal, since the distribution of the oxygen density in the crystal in axial and radial directions is influenced by the number of crucible and crystal rotations, the number of crucible and crystal rotations cannot be greatly changed without affecting quality maintenance. In this case, the present invention suggests: in case the number of vibrations for driving the melt, determined on the basis of the number of crucible rotations and the number of crystal rotations during the single crystal growing procedure, is within the range from 95% to 105% of the number of sloshing resonance vibrations of the melt, the number of crucible and crystal rotations or either of the two is controlled, to prevent the number of vibrations of the melt due to sloshing from exceeding 2000 times during the period when the number of vibrations is within that range.

The period when the number of vibrations for driving the melt is within the range of 95% to 105% of the number of sloshing resonance vibrations for the melt is shortened, lest the period should exceed 2000 times. In this manner, it is possible to prevent the crystal from being deformed and becoming polycrystalline, though the waves occur on the surface of the melt.

Here, it is known that the number of sloshing vibrations for the melt in the crucible is determined on the basis of the shape of the crucible and the quantity of the melt, and does not depend on the density and the viscosity of the melt. This relation can be recognised in the following manner.

According to a first method, in case the shape of a container to be used is cylindrical or hemispherical and the formula of the relation between the quantity of the melt and the number of sloshing vibrations is analytically determined, these container and formula may be used.

FIG. 2 shows the relation between various kinds of the numbers of sloshing resonance vibrations occurring in the crucible with the inner diameter of 150 mm and the quantity of the melt in the crucible, on the basis of the analysis (see JSME Mechanical Engineers' Handbook compiled by Japan Society of Mechanical Engineers (1987), page A3–135). In FIG. 2, the solid line, the broken line and the one-dot broken line show the conditions that cause the sloshing resonance in modes (1,1), (1,2), and (0,1), respectively. In this case, the numerical values on both sides in parentheses of the resonance modes mean the number of waves in peripheral and diametral directions, respectively.

According to a second method, a predetermined quantity of water is put into the crucible and waved, time variation of the water surface elevation are detected by a displacement sensor, and the vibration responses are analyzed by an FFT analyser, so that the number of sloshing resonance vibrations in case of the predetermined quantity of the melt can be experimentally determined. The relation between the quantity of the melt and the number of sloshing resonance vibrations can be determined by repeating the above-mentioned measurement with the quantity of water varied. The number of sloshing resonance vibrations does not depend on the density and the viscosity of the melt, and therefore the water can be substituted for the actual melt as the raw material.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views:

FIG. 3 is a curve that shows the relation between the operating conditions and the number of sloshing resonance vibrations in the embodiments and the comparative example of the present invention.

DETAILED DESCRIPTION OF THE PREFERRED EMBODIMENT

Figure 1:
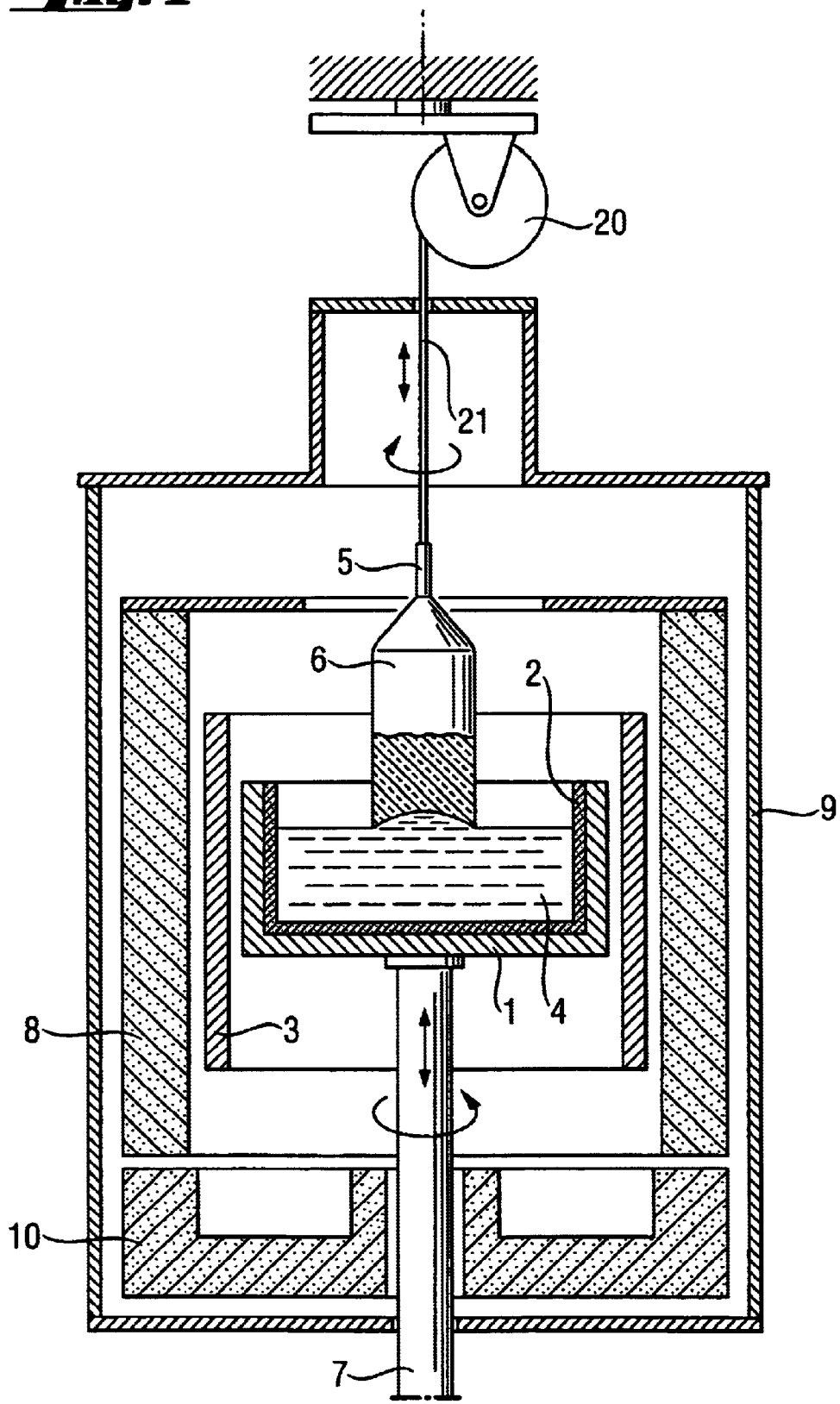
FIG. 1 is a schematic diagram of a crystal pulling device based on the Czochralski method.
Figure 2:
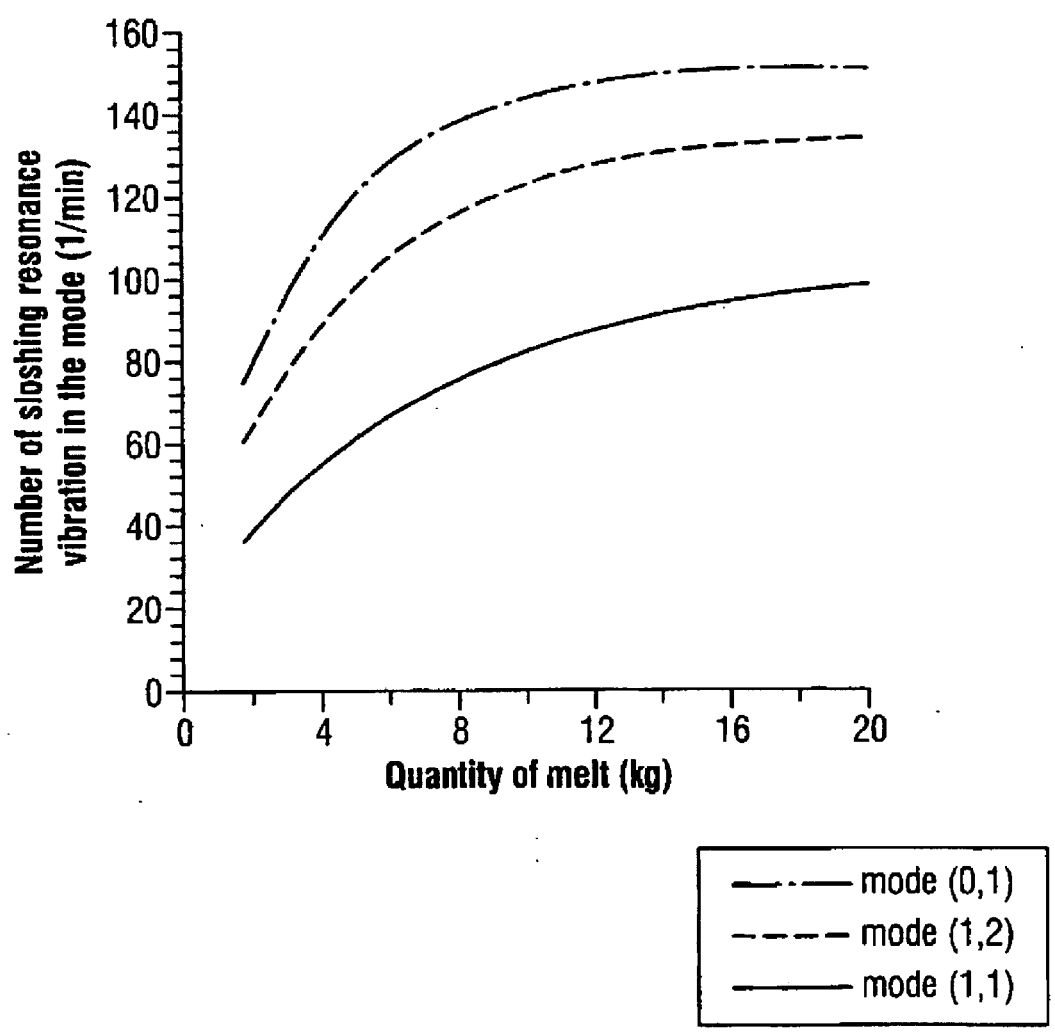
FIG. 2 is a curve that shows the number of sloshing resonance vibrations and the quantity of the melt in a cylindrical crucible having the inner diameter of 150 mm.

FIG. 3 is a diagram for explaining the embodiments and a comparative example, each relating to the present invention. In case of growing a silicon single crystal by using a seed crystal with the (100) orientation in the cylindrical crucible having an inner diameter of 150 mm and a depth of 150 mm by means of the single crystal pulling-up method based on the Czochralski method, FIG. 3 shows the melt driving frequency being caused by the crystal rotation and being the greatest excitation source, with FIG. 2 overlapped with the relation between the value of the number of melt driving vibrations and the quantity of the melt. The number of melt driving vibrations is four times as great as the relative number of crystal rotations with respect to the crucible, and caused by four crystal habit lines that occur at the edge of the growing interface of the crystal having the (100) orientation.

COMPARATIVE EXAMPLE 1

In the single crystal pulling device, the silicon raw material of 20 kg is molten in the cylindrical crucible having an inner diameter of 150 mm and a depth of 150 mm, and the growth of the silicon single crystal is commenced with the use of a seed crystal of the (100) orientation. The crystal is grown with the crucible rotated with the predetermined number of rotations as 10 rpm (rotations per minute) and the one of the crystal as 20 rpm (the relative number of revolutions: 30 rpm) in a direction opposite to the crucible, from the time when the seed crystal is dipped into the melt. At this time, since the orientation of the seed crystal is (100), four projections due to the crystal habit lines each being approximately identical in size are formed at the edge of the growing interface of the crystal. And, the melt in the crucible has been continuously vibrated mainly with the number of vibrations as 120 rpm.

As the crystal is grown, when the weight of the melt in the crucible reaches 9.5 kg, the number of vibrations of 120 rpm that the crystal gives to the melt approaches the number of sloshing resonance vibrations in the mode (1,2), and therefore waves suddenly occur on the surface of the melt. Further, when the weight of the melt in the crucible reaches 9.0 kg, the crystal is terribly deformed and falls short of the standard of the crystal. While the crystal pulling-up is continued under such a circumstance, the waves on the surface of the melt are settled when the quantity of the melt reaches 8 kg, and the diameter of the crystal is again within the range of the standard. While the crystal pulling-up is continued, when the quantity of the melt reaches 5 kg, waves on the surface of the melt start to occur due to the sloshing resonance in the mode (0,1). When the quantity of the melt reaches 4.5 kg, the crystal turns out to become polycrystalline. The crystal pulling-up is continued and the waves on the surface of the melt are settled when the quantity of the melt reaches 4 kg.

Embodiment 1

The silicon raw material of 20 kg is molten in a cylindrical crucible having an inner diameter of 150 mm and a depth of 150 mm, and a silicon single crystal is grown with the use of the seed crystal having the (100) orientation. The crystal is grown in such a manner that the crucible is revolved at the predetermined number of rotations of 10 rpm and the crystal is revolved at the number of rotations of 20 rpm in a direction opposite to the crucible, from the time when the seed crystal is dipped into the melt till the quantity of the melt reaches 13 kg. At this time, since the orientation of the seed crystal is (100), four projections due to the crystal habit lines each being approximately identical in size are formed at the edge of the growing interface of the crystal. And, the melt in the crucible has been continuously vibrated mainly with the number of vibrations as 120 rpm.

From the time when the quantity of the melt reaches 12.5 kg, as shown in Table 1, by reducing the number of crucible and/or crystal rotations as the quantity of the melt decreases, the number of crucible rotations and the one of the crystal are controlled, so that the number of vibrations of the melt driven by the crystal is always below 95% of the number of sloshing vibrations.

As a result, the following effects can be realized: the crystal pulling-up can be completed, with the melt of 3.3 kg left, without causing waves on the surface of the melt in pulling up the crystal and causing the crystal to be deformed and become polycrystalline.

Table 1 shows the relation among the number of crucible rotations, the number of crystal rotations, and the number of sloshing resonance revolutions and the ratio of the number of resonance vibrations to the number of driving vibrations, when the crystal is grown in accordance with Embodiment 1.

to pass through the resonance region. Though waves on the surface of the melt are recognized for these 15 minutes (the number of vibrations, 1933=128.9 rpm×15 minutes), the crystal undergoes no change and does not become polycrystalline. When the pulling-up is further continued and the quantity of the melt reaches 4.0 kg, the number of vibrations of the crucible and crystal are restored to the original numbers of vibrations (10 rpm and 20 rpm), respectively.

Consequently, the crystal pulling-up can be completed, with the melt of 3.3 kg left, without causing waves on the surface of the melt during the pulling-up and causing the crystal to be deformed and become polycrystalline.

TABLE 1

| Quantity of melt (kg) | A: crucible rotation (rpm) | B: crystal rotation (rpm) | C: Number of driving vibration (1/min); C = 4×(A + B) | D: Number of sloshing resonance vibrations in the mode (1,2) (1/min) | E: Ratio of number of driving/resonance vibrations (%); E = (C/D) |
|---|---|---|---|---|---|
| 20 | 10 | 20 | 120 | 131.6 | 91% |
| 12.5 | 10 | 20 | 120 | 128.7 | 93% |
| 11.6 | 9 | 20 | 116 | 127.4 | 91% |
| 10 | 8 | 20 | 112 | 123.8 | 90% |
| 8.3 | 8 | 18 | 104 | 118.4 | 88% |
| 6.6 | 6 | 18 | 96 | 110.6 | 87% |
| 5 | 5 | 16 | 84 | 99.6 | 84% |
| 4 | 5 | 16 | 84 | 90.9 | 92% |

Embodiment 2

The raw material of 20 kg is molten in the cylindrical crucible having an inner diameter of 150 mm and a depth of 150 mm to grow a silicon single crystal with the use of the seed crystal having the (100) orientation. The crystal is grown in the following manner: the crucible is rotated at 10 rpm from the time when the seed crystal is dipped into the melt till the quantity of the melt reaches 12.5 kg, and the crystal is rotated at 20 rpm in a direction opposite to the crucible. At this time, the number of vibrations of the melt driven by the crystal is 120 rpm. When the quantity of the melt reaches 12.5 kg, the number of sloshing resonance vibrations in the mode (1,2) approaches 93% of the number of vibrations of the melt driven by the crystal.

Therefore, the number of rotations of the crystal and crucible are increased to 22 rpm and 12 rpm, respectively for 15 minutes (i.e. the time corresponding to the number of vibrations of the melt due to the sloshing, 1930=128.7 rpm×15 minutes). Though waves on the surface of the melt are recognized for these 15 minutes, the crystal undergoes no change and does not become polycrystalline. For this period, the quantity of the melt reaches 12.0 kg and the number of driving vibrations of the melt reaches 106% of the number of sloshing resonance vibrations in the mode (1, 2). After that, as shown in Table 2, when the quantity of the melt reaches 9.0 kg, the number of crucible rotations and the one of the crystal are reduced to 11 rpm and 21 rpm, respectively. When the quantity of the melt reaches 6.0 kg, the number of crucible rotations is restored to 10 rpm and the number of revolutions of the crystal is maintained at 21 rpm. The ratio of the number of sloshing resonance vibrations in the mode (1,2) to the number of driving vibrations at this time, is 116%. When the pulling-up is further continued and the quantity of the melt reaches 5.5 kg, the period of the number of vibrations of the melt driven by the crystal approached the number of sloshing resonance vibrations in the mode (0,1).

Therefore, the number of crystal and crucible rotations are increased to 21 rpm and 12 rpm, respectively for 15 minutes (the time for passing through the sloshing resonance region)

Table 2 shows the relation among the number of crucible rotations, the number of crystal rotations, the number of resonance revolutions and the ratio of the number of sloshing resonance vibrations to the number of resonance vibrations and the number of driving vibrations, when the crystal is grown in accordance with Embodiment 2.

TABLE 2

| Quantity of melt (kg) | A | B | C | D1 | D2 | E1 | E2 |
|---|---|---|---|---|---|---|---|
| 20 | 10 | 20 | 120 | 131.6 | 150.8 | 91 | 80 |
| 12.5 | 10 | 20 | 120 | 128.7 | 147.9 | 93 | 81 |
| 12 | 12 | 22 | 136 | 128.1 | 147.5 | 106 | 90 |
| 9 | 11 | 21 | 128 | 120.8 | 142 | 106 | 92 |
| 6 | 10 | 21 | 124 | 106.8 | 128.9 | 116 | 93 |
| 5.5 | 12 | 21 | 132 | 103.5 | 125.5 | 128 | 105 |
| 4 | 10 | 20 | 120 | 90.9 | 111.2 | 132 | 107 |
| 3.3 | 10 | 20 | 120 | 83.9 | 103.7 | 143 | 116 |

A: Crucible rotation (rpm)
B: Crystal rotation (rpm)
C: The number of driving vibrations (1/min); C=4×(A+B)
D1: The number of sloshing resonance vibrations in the mode (1,2) (1/min)
D2: The number of sloshing resonance vibrations in the mode (0,1) (1/min)
E1: Ratio of the number of driving/resonance vibrations (%); E1=(C1/D1)
E2: Ratio of the number of driving/resonance vibrations (%); E2=(C2/D2)

As described above, in Embodiment 1 of the present invention, as clarified in FIG. 3, the number of crucible and/or crystal rotations is controlled, so that the number of vibrations of the melt driven by the crystal exists between the curves of the numbers of sloshing resonance vibrations in the modes (1,1) and (1,2). In Embodiment 2, while the curve of the number of driving vibrations by the crystal crosses the curve of the number of sloshing resonance vibrations in the mode (0,1), the number of crucible and/or crystal rotations is controlled with the crossing transition period as a short one, i.e. so that the number of vibrations of the melt due to the sloshing dose not exceed 2000 times.

Effect of the Invention

As explained above, according to the present invention, when the crystal is pulled up and produced in accordance with the Czochralski method, waves that suddenly occur can be avoided by preventing the number of driving vibrations by the melt determined on the basis of the number of vibrations of the crystal and crucible from according with the number of sloshing resonance vibrations in the remaining quantity of the melt, to thereby prevent the crystal from becoming polycrystalline and being dislocated, so that the yield can be greatly improved.

The present invention is more effective than countermeasures against waves on the surface of a melt, such as adjusting and improving, etc. mechanisms in a conventional single crystal production apparatus based on the Czochralski method.

Accordingly, while only a few embodiments of the present invention have been shown and described, it is obvious that many changes and modifications may be made thereunto without departing from the spirit and scope of the invention.

What is claimed is:

1. A single crystal production method based on the Czochralski method, comprising:
    (a) controlling a number of crucible rotations and crystal rotations so that a number of vibrations for driving a melt, is based on the number of crucible and crystal rotations during a single crystal growing procedure.

2. A single crystal production method based on the Czochralski method, comprising:
    (a) controlling a number of rotations of a crystal and crucible, so that when a number of vibrations for driving a melt, determined by the number of crucible and crystal rotations during a single crystal growing procedure, the number of vibrations of the melt due to sloshing does not exceed 2000 times during a period when the number of vibrations is within said range.

* * * * *